(12) United States Patent
Jak et al.

(10) Patent No.: US 10,634,490 B2
(45) Date of Patent: Apr. 28, 2020

(54) DETERMINING EDGE ROUGHNESS PARAMETERS

(71) Applicant: ASML Netherlands B.V., Veldhoven (NL)

(72) Inventors: Martin Jacobus Johan Jak, 's-Hertogenbosch (NL); Richard Quintanilha, Eindhoven (NL); Arie Jeffrey Den Boef, Waalre (NL); Michael Kubis, Meerbusch (DE)

(73) Assignee: ASML Netherlands B.V., Veldhoven (NL)

( * ) Notice: Subject to any disclaimer, the term of this patent is extended or adjusted under 35 U.S.C. 154(b) by 147 days.

(21) Appl. No.: 15/988,681

(22) Filed: May 24, 2018

(65) Prior Publication Data

US 2018/0364036 A1 Dec. 20, 2018

(30) Foreign Application Priority Data

Jun. 20, 2017 (EP) ..................................... 17176802
Oct. 6, 2017 (EP) ..................................... 17195151

(51) Int. Cl.
*G01J 1/42* (2006.01)
*G01B 11/30* (2006.01)
(Continued)

(52) U.S. Cl.
CPC .............. *G01B 11/30* (2013.01); *G01B 15/08* (2013.01); *G03F 7/70625* (2013.01); *G03F 7/70683* (2013.01); *G01B 2210/56* (2013.01)

(58) Field of Classification Search
CPC .... G01B 11/30; G01B 15/08; G01B 2210/56; G03F 7/70683; G03F 7/70625
See application file for complete search history.

(56) References Cited

U.S. PATENT DOCUMENTS 5,229,872 A 7/1993 Mumola
5,296,891 A 3/1994 Vogt et al.
(Continued)

FOREIGN PATENT DOCUMENTS

EP 1 628 164 A2 2/2006
EP 3 296 723 A1 3/2018
(Continued)

OTHER PUBLICATIONS

Bunday et al., "Determination of optimal parameters for CD-SEM measurement of line-edge roughness," 2004, Proceedings of SPIE, vol. 5375, pp. 515-533. (Year: 2004).*

(Continued)

*Primary Examiner* — Kiho Kim
(74) *Attorney, Agent, or Firm* — Sterne, Kessler, Goldstein & Fox P.L.L.C.

(57) ABSTRACT

A method of determining an edge roughness parameter has the steps: (1010) controlling a radiation system to provide a spot of radiation at a measurement position for receiving a substrate; (1020) receiving a measurement signal from a sensor for measuring intensity of a forbidden diffraction order (such as a second order) being diffracted by a metrology target at the measurement position when the metrology target is illuminated by the spot of radiation, the metrology target comprising a repetitive pattern being configured by configuration of a linewidth/pitch ratio (of about 0.5) to control an amount of destructive interference that leads to forbidding of the diffraction order, the sensor being configured to provide the measurement signal based on the measured intensity; and (1040) determining an edge roughness parameter based on the measured intensity of the forbidden diffraction order.

18 Claims, 7 Drawing Sheets

(51) Int. Cl.
*G03F 7/20* (2006.01)
*G01B 15/08* (2006.01)

(56) References Cited

U.S. PATENT DOCUMENTS

| | | | |
|---|---|---|---|
| 5,361,137 | A | 11/1994 | Aton et al. |
| 5,523,193 | A | 6/1996 | Nelson |
| 6,952,253 | B2 | 4/2005 | Lof et al. |
| 7,869,020 | B1 * | 1/2011 | Lee .................. G01N 21/95623 356/237.1 |
| 8,045,179 | B1 | 10/2011 | Zhuang et al. |
| 8,681,312 | B2 | 6/2014 | Straaijer |
| 10,191,391 | B2 | 1/2019 | Pandey et al. |
| 2004/0190008 | A1 | 9/2004 | Mieher et al. |
| 2004/0218192 | A1 | 11/2004 | Bischoff et al. |
| 2007/0224518 | A1 | 9/2007 | Yokhin et al. |
| 2007/0296960 | A1 | 12/2007 | Den Boef et al. |
| 2008/0198380 | A1 | 8/2008 | Straaijer et al. |
| 2009/0168062 | A1 | 7/2009 | Straaijer |
| 2010/0007863 | A1 | 1/2010 | Jordanoska |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0102793 | A1 | 5/2011 | Straaijer |
| 2011/0188020 | A1 | 8/2011 | Den Boef |
| 2011/0249244 | A1 | 10/2011 | Leewis et al. |
| 2012/0044470 | A1 | 2/2012 | Smilde et al. |
| 2012/0044495 | A1 | 2/2012 | Straaijer |
| 2013/0010306 | A1 * | 1/2013 | Coene .................. G01B 15/04 356/508 |
| 2013/0162996 | A1 | 6/2013 | Straaijer et al. |
| 2013/0182263 | A1 | 7/2013 | Shchegrov et al. |
| 2013/0304424 | A1 | 11/2013 | Bakeman et al. |
| 2013/0308142 | A1 | 11/2013 | Straaijer |
| 2014/0019097 | A1 | 1/2014 | Bakeman et al. |
| 2016/0161863 | A1 | 6/2016 | Den Boef et al. |
| 2016/0282282 | A1 | 9/2016 | Quintanilha et al. |
| 2016/0370717 | A1 | 12/2016 | Den Boef et al. |
| 2017/0045823 | A1 | 2/2017 | Quintanilha |
| 2017/0184511 | A1 | 6/2017 | Den Boef et al. |

FOREIGN PATENT DOCUMENTS

| | | |
|---|---|---|
| EP | 3 321 739 A1 | 5/2018 |
| TW | 201721093 A | 6/2017 |
| WO | WO 1999/049504 A1 | 9/1999 |
| WO | WO 2015/172963 A1 | 11/2015 |
| WO | WO 2017/025392 A1 | 2/2017 |
| WO | WO 2017/108404 A1 | 6/2017 |
| WO | WO 2017/108410 A1 | 6/2017 |

OTHER PUBLICATIONS

Bertilson, M., "Laboratory Soft X-Ray Microscopy and Tomography," KTH Engineering Sciences, 2011; pp. 21-22.

Boher, P., et al., "Optical Fourier Transform Scatterometry for LER and LWR Metrology," Proceedings of SPIE: Metrology, Inspection, and Process Control for Microlithography XIX, vol. 5752, 2005; pp. 192-203.

Kato, A., et al., "The Effect of Line Roughness on the Reconstruction of Line Profiles for EUV Masks from EUV Scatterometry," Proceedings of SPIE: Extreme Ultraviolet (EUV) Lithography, vol. 7636, 2010; pp. 1-8.

KMLabs, Examples of EUV Systems, accessed at http://www.kmlabs.com/, 2018; 3 pages.

Lemaillet, P., et al., "Intercomparison Between Optical and X-Ray Scatterometry Measurements of FinFET Structures", Proceedings of SPIE: Metrology, Inspection, and Process Control for Microlithography XXVII, vol. 8681, 2013; pp. 1-8.

Scholze, F., et al., "The Influence of Line Edge Roughness and CD Uniformity on Euv Scatterometry for CD Characterization of EUV Masks," Proceedings of SPIE: Modeling Aspects in Optical Metrology, vol. 6617, 2007; pp. 1-10.

Scholze, F., et al., "Use of EUV Scatterometry for the Characterization of Line Profiles and Line Roughness on Photomasks," Proceedings of SPIE: 24th European Mask and Lithography Conference, vol. 6792, 2008, pp. 1-9.

Shih, W. C., et al., "High Resolution Electrostatic Analog Tunable Grating with a Single-Mask Fabrication Process," Journal of Microelectromechanical Systems, vol. 15, No. 4, 2006; pp. 763-769.

International Search Report and Written Opinion of the International Searching Authority directed to related International Patent Application No. PCT/EP2018/062778, dated Jul. 2, 2018; 11 pages.

\* cited by examiner

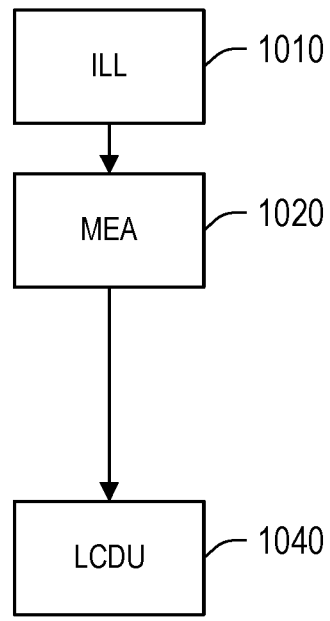
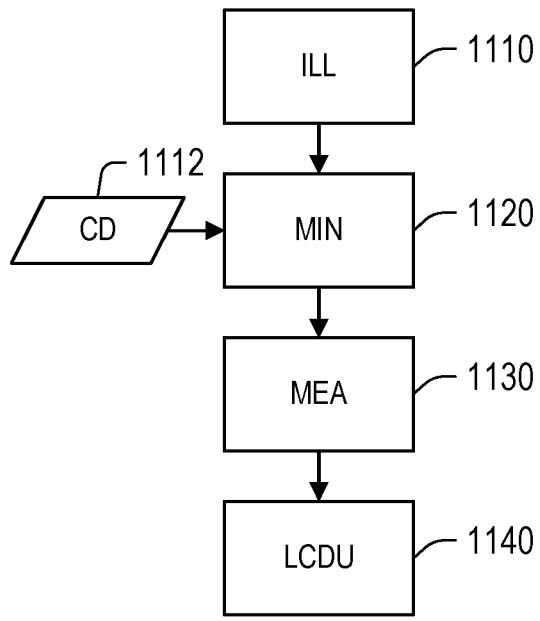
Fig. 10
Fig. 11
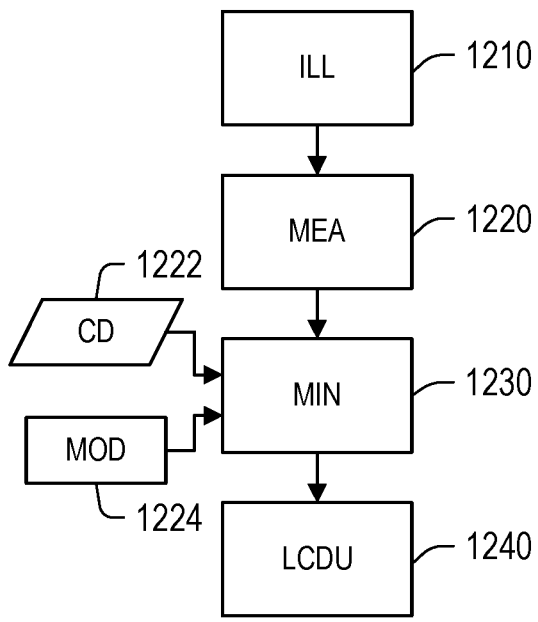
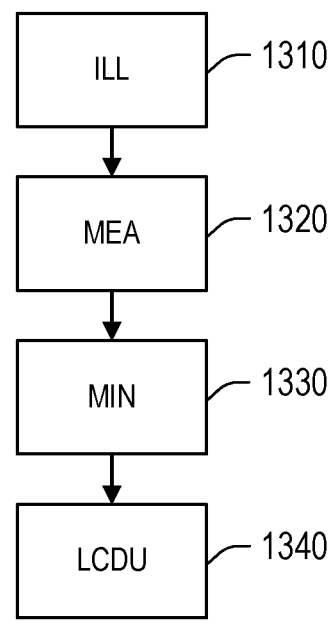
Fig. 12
Fig. 13

DETERMINING EDGE ROUGHNESS PARAMETERS

FIELD

The present disclosure relates to metrology apparatuses, lithographic cells, methods of determining an edge roughness parameter, and associated computer program products usable, for example, in the manufacture of devices by lithographic techniques.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-k1 lithography may be used to process features with dimensions smaller than the classical resolution limit of a lithographic apparatus. In such process, the resolution formula may be expressed as CD=k1×λ/NA, where λ is the wavelength of radiation employed, NA is the numerical aperture of the projection optics in the lithographic apparatus, CD is the "critical dimension" (generally the smallest feature size printed, but in this case half-pitch) and k1 is an empirical resolution factor. In general, the smaller k1 the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

At the same time, the known inspection techniques employ radiation in the visible or ultraviolet waveband. This limits the smallest features that can be measured, so that the technique can no longer measure directly the smallest features made in modern lithographic processes. To allow measurement of smaller structures, it has been proposed to use radiation of shorter wavelengths, similar for example to the extreme ultraviolet (EUV) wavelengths used in EUV lithography. Such wavelengths may be in the range 1 to 100 nm, for example, or 1-125 nm. Part or all of this wavelength range may also be referred to as soft x-ray (SXR) wavelengths. Some authors may use SXR to refer to a narrower range of wavelengths, for example in the range 1-10 nm or 1-20 nm. For the purposes of the present disclosure, these terms SXR and EUV will be used without implying any hard distinction. Metrology using harder x-rays, for example in the range 0.1-1 nm is also contemplated. Examples of transmissive and reflective metrology techniques using these wavelengths in transmissive and/or reflective scattering modes are disclosed in published patent application WO2015172963A1. Further examples of metrology techniques and apparatuses using these wavelengths in transmissive and/or reflective scattering modes are disclosed in the published patent applications US2016282282A1, US2017045823A1, WO2017025392A1 and WO2017108404, the latter being international patent application number PCT/EP2016/080058, not published at the present priority date. The contents of all these applications are incorporated herein by reference.

Convenient sources of SXR radiation include higher harmonic generation (HHG) sources, in which infrared pump radiation from a laser is converted to shorter wavelength radiation by interaction with a gaseous medium. HHG sources are available for example from KMLabs, Boulder Colo., USA (http://www.kmlabs.com/). Various modifications of HHG sources are also under consideration for application in inspection apparatus for lithography. Some of these modifications are disclosed for example in European patent application number 16198346.5 dated Nov. 11, 2016, not been published at the priority date of the present application. Other modifications are disclosed in U.S. patent application Ser. No. 15/388,463, published as US2017184511, and international patent application PCT/EP2016/080103, published as WO2017108410. Those two applications both claimed priority from European patent application no. 15202301.6 dated Dec. 23, 2015 and were not published at the priority date of the present application. European patent application no. 16188816.9 dated Sep. 14, 2016, not published at the present priority date, describes the correction of wavefronts in an HHG radiation source to minimize blurring of the measurement spot in an inspection apparatus. The contents of all of these applications are incorporated herein by reference.

As an example of CD measurement using an optical technique, U.S. Pat. No. 5,361,137 discloses a method and apparatus for measuring submicron linewidths, using diffraction gratings. A set of "fixed-linewidth variable-pitchwidth" test gratings has a number of gratings, each grating having the same linewidth but having different pitchwidths. These gratings are illuminated to form diffraction patterns. A set of peak intensities of the first or second order diffraction image from each grating is recorded. Either of these intensity values forms a curve around an extrema, which represents the intensity from a grating whose pitchwidth is equal to one-half the linewidth.

Lithographic patterning performance is now being driven by edge placement errors (EPE). The position of the edge of a feature is determined by the feature's lateral position (Overlay) and the size of the feature (CD). Part of this is very local and stochastic in nature. E.g. Line Edge Roughness (LER) results in very local CD variations. It is expected that for future lithography nodes this local CD uniformity (LCDU) will become a large, dominant contributor to the EPE performance. Since LCDU will become so important, it will become important to control it and minimize it, by optimizing the process conditions. As a first step in this it is necessary to measure and monitor the LCDU.

Although linewidths are measured using various known optical techniques, LCDU and LER parameters are currently obtained by means of CD-SEM (CD Scanning Electron Microscope) inspection technologies. Therefore, compared to optical techniques, only a sparse sampling can be used, or the measurement time explodes if a large number of LCDU parameters must be obtained.

SUMMARY

It is desirable to provide a method to determine Edge Placement Error characteristics, and LCDU and LER parameters in particular, in a more efficient manner. It is desirable to use an optical technique to take advantage of the improvements in scatterometers that use shorter wavelength radiation.

According to a first aspect of the present invention, there is provided a metrology apparatus comprising:
 a measurement position for receiving a substrate;
 a radiation system for providing a spot of radiation at the measurement position; and
 a sensor for measuring intensity of a forbidden diffraction order being diffracted by a metrology target at the measurement position when the metrology target is illuminated by the spot of radiation, the metrology target comprising a repetitive pattern being configured to control an amount of destructive interference that leads to forbidding of the diffraction order, the sensor being configured to provide a measurement signal based on the measured intensity,
 a controller operable to:
 receive the measurement signal; and
 determine an edge roughness parameter based on the measured intensity of the forbidden diffraction order.

According to a second aspect of the present invention, there is provided a lithographic cell comprising the metrology apparatus according to the first aspect.

According to a third aspect of the present invention, there is provided a metrology target being provided on a patterning device, such as for example a reticle, or being patterned on a substrate, such as for example a wafer, the metrology target comprising a plurality of regions, wherein in the different regions different repetitive patterns are provided having different configurations to differently control an amount of destructive interference that leads to forbidding of a diffraction order.

According to a fourth aspect of the present invention, there is provided a method of determining an edge roughness parameter, the method comprising:
 providing a spot of radiation at a measurement position;
 measuring intensity of a forbidden diffraction order being diffracted by a metrology target at the measurement position, the metrology target comprising a repetitive pattern configured to control an amount of destructive interference that leads to forbidding of the diffraction order; and
 determining an edge roughness parameter based on the measured intensity of the forbidden diffraction order.

According to a fifth aspect of the present invention, there is provided a method of determining an edge roughness parameter, the method comprising:
 controlling a radiation system to provide a spot of radiation at a measurement position for receiving a substrate;
 receiving a measurement signal from a sensor for measuring intensity of a forbidden diffraction order being diffracted by a metrology target at the measurement position when the metrology target is illuminated by the spot of radiation, the metrology target comprising a repetitive pattern being configured to control an amount of destructive interference that leads to forbidding of the diffraction order, the sensor being configured to provide the measurement signal based on the measured intensity; and
 determining an edge roughness parameter based on the measured intensity of the forbidden diffraction order.

According to a sixth aspect of the present invention, there is provided a computer program product comprising a non-transitory computer readable medium having instructions recorded thereon, the instructions, when executed by a controller of a metrology apparatus, implementing the method of the fourth or fifth aspects.

BRIEF DESCRIPTION OF THE DRAWINGS

Embodiments of the invention will now be described, by way of example only, with reference to the accompanying schematic drawings, in which:

FIGS. 10 to 13 are flowcharts of methods of determining an edge roughness parameter according to embodiments of the present invention.

DETAILED DESCRIPTION

In the present disclosure, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. More information on such mirror arrays is given in U.S. Pat. Nos. 5,296,891 and 5,523,193, which are incorporated herein by reference.

a programmable LCD array. An example of such a construction is given in U.S. Pat. No. 5,229,872, which is incorporated herein by reference.

Figure 1:
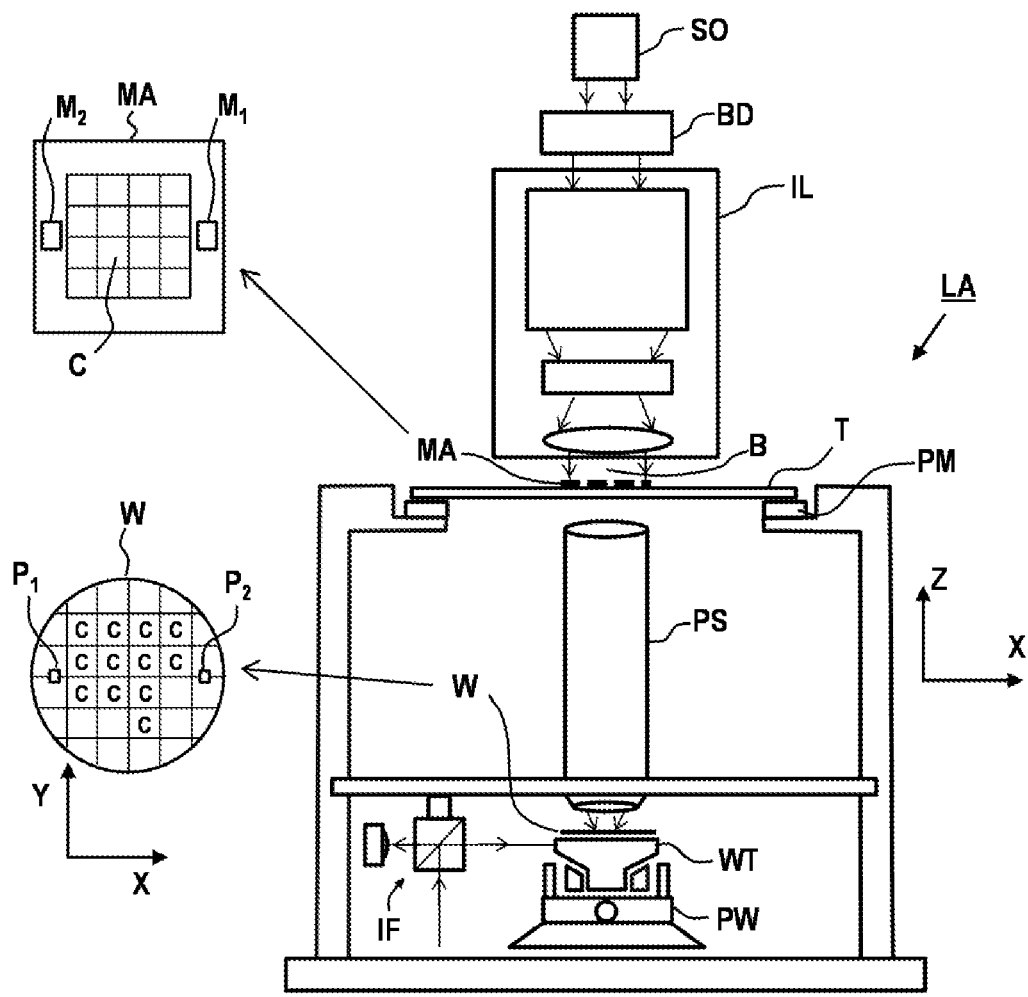
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support structure (e.g., a mask table) T constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT publication No. WO99-49504, which are incorporated herein by reference.

The lithographic apparatus LA may also be of a type having two (dual stage) or more substrate tables WT and, for example, two or more support structure T (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table T), and is patterned by the patterning device MA. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the mask MA with respect to the path of the radiation beam B. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Figure 2:
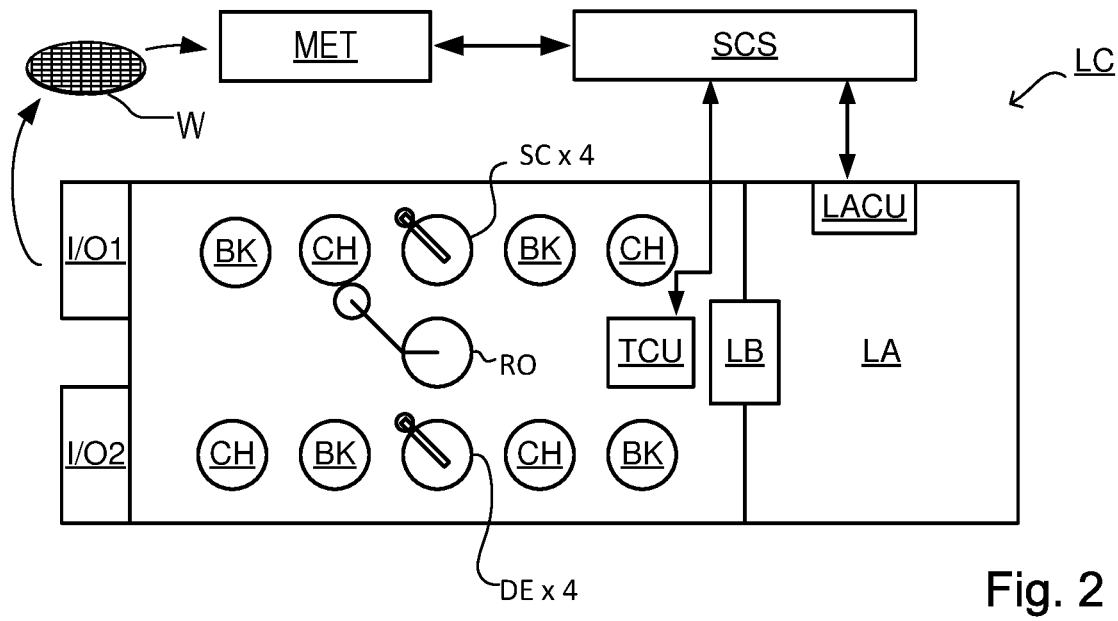
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, one or more inspection tool MET may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
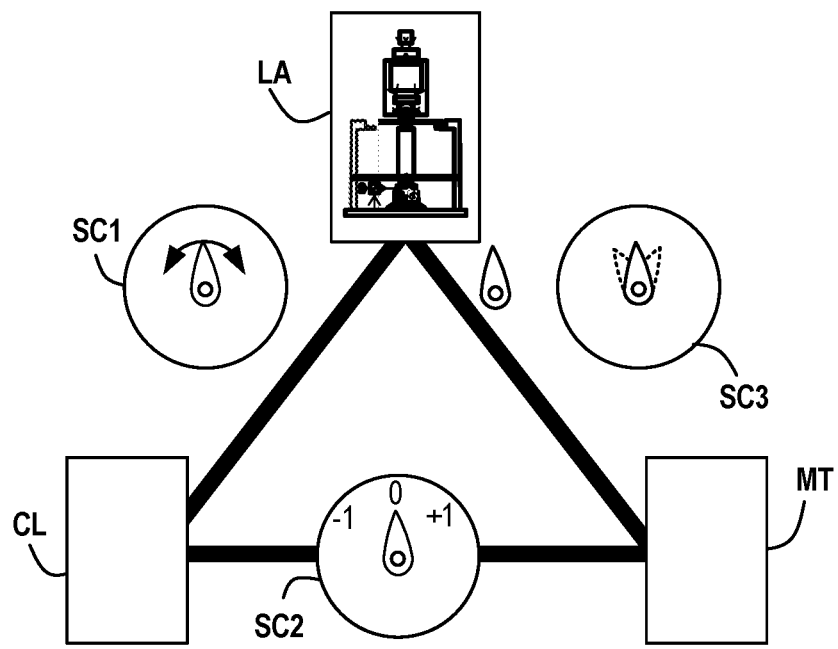
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray, visible light to near-IR wavelength range.

The scatterometer MT may be an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

Alternatively, the scatterometer MT may be a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

Alternatively, the scatterometer MT may be an ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922, 587, 13/000,229, 13/033,135, 13/533,110 and 13/891,410 incorporated herein by reference in their entirety.

A metrology target may be an ensemble of composite gratings, formed by a lithographic process, mostly in resist, but also after etch process for example. Typically the pitch and line-width of the structures in the gratings strongly depend on the measurement optics (in particular the NA of the optics) to be able to capture diffraction orders coming from the metrology targets. The targets may be measured in an underfilled mode or in an overfilled mode. In the underfilled mode, the measurement beam generates a spot that is smaller than the overall target. In the overfilled mode, the measurement beam generates a spot that is larger than the overall target. In such overfilled mode, it may also be possible to measure different targets simultaneously, thus determining different processing parameters at the same time.

Overall measurement quality of a lithographic parameter using a specific target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and not yet published U.S. patent application Ser. No. 15/181,126, incorporated herein by reference in its entirety.

As an alternative to metrology methods in which visible light or UV light is used, it has also been considered to use X-rays or EUV radiation, for example radiation between 0.1 nm and 100 nm, optionally in between 1 nm and 50 nm, optionally in between 10 nm and 20 nm. In this document the abbreviation SXR is used to indicate light in the above discussed wavelength ranges that fully or partially overlap with the wavelength range of Soft X-rays and/or EUV radiation. One example of metrology tool functioning in the SXR range is transmissive small angle X-ray scattering (T-SAXS as in US 2007224518A which contents are incorporated herein by reference in their entirety). Profile (CD) measurements using T-SAXS are discussed by Lemaillet et al in "Intercomparison between optical and X-ray scatterometry measurements of FinFET structures", Proc. of SPIE, 2013, 8681. Reflectometry techniques using X-rays (GI-XRS) and extreme ultraviolet (EUV) radiation at grazing incidence are known for measuring properties of films and stacks of layers on a substrate. Within the general field of reflectometry, goniometric and/or spectroscopic techniques can be applied. In goniometry, the variation of a reflected beam with different incidence angles is measured. Spectroscopic reflectometry, on the other hand, measures the spectrum of wavelengths reflected at a given angle (using broadband radiation). For example, EUV reflectometry has been used for inspection of mask blanks, prior to manufacture of reticles (patterning devices) for use in EUV lithography.

It is possible that the range of application makes the use of wavelengths in the SXR domain not sufficient. Therefore published patent applications US 20130304424A1 and US2014019097A1 (Bakeman et al/KLA) describe hybrid metrology techniques in which measurements made using x-rays and optical measurements with wavelengths in the range 120 nm and 2000 nm are combined together to obtain a measurement of a parameter such as CD. A CD measurement is obtained by coupling an x-ray mathematical model and an optical mathematical model.

Figure 4:
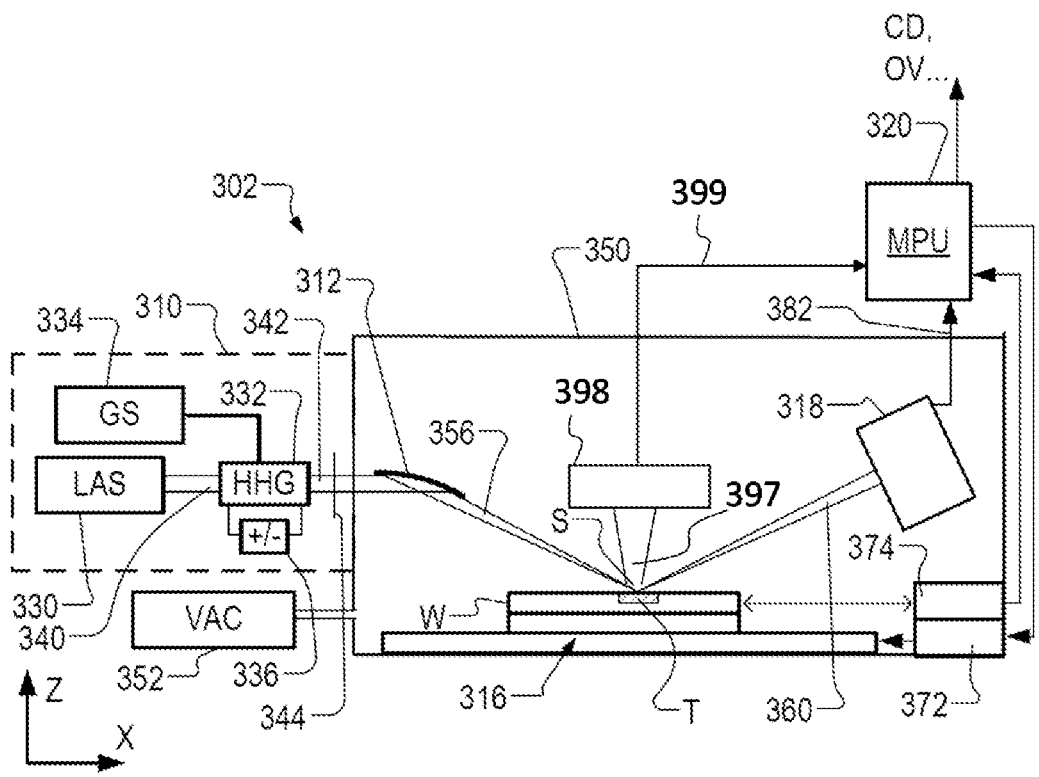
FIG. 4 depicts a schematic representation of a metrology apparatus in which radiation in the wavelength range from 0.1 nm to 100 nm may be used to measure parameters of structures on a substrate.

FIG. 4 depicts a schematic representation of a metrology apparatus 302 in which radiation in the wavelength range from 0.1 nm to 100 nm may be used to measure parameters of structures on a substrate. The metrology apparatus 302 presented in FIG. 4 is suitable for the SXR domain.

FIG. 4 illustrates a schematic physical arrangement of a metrology apparatus 302 comprising a spectroscopic scatterometer using EUV/SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths. Inspection apparatus 302 comprises a radiation source 310, illumination system 312, substrate support 316, detection system 318 and metrology processing unit (MPU) 320. Source 310 in this example comprises a generator of EUV or soft x-ray radiation based on high harmonic generation (HHG) techniques. Such sources are available for example from KMLabs, Boulder Colo., USA (http://www.kmlabs.com/). Main components of the radiation source are a drive laser 330 and an HHG gas cell 332. A gas supply 334 supplies suitable gas to the gas cell, where it is optionally ionized by an electric source 336. The drive laser may be for example a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 µm (1 micron). The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). $N_2$, $O_2$, He, Ar, Kr, Xe gases can all be considered. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. One or more wavelengths in the range 1-20 nm or optionally in the range 1-10 nm or optionally in the range 10-20 nm may be chosen, for example. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection at a measurement position by substrate support 316. The structure of interest is labeled T. The atmosphere within inspection chamber 350 is maintained near vacuum by vacuum pump 352, so that EUV radiation can pass with-out undue attenuation through the atmosphere. The Illumination system 312 has the function of focusing the radiation into a focused beam 356, and may comprise for example a two-dimensionally curved mirror, or a series of one-dimensionally curved mirrors, as described in international application number PCT/EP2016/080058, mentioned above. The focusing is performed to achieve a round or elliptical spot S under 10 µm in diameter, when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise an SXR spectroscopic reflectometer of the kind described in US2016282282A1. Tilting of the substrate in one or more dimensions may also be provided.

If the target T has a certain periodicity, the radiation of the focused beam 356 may be partially diffracted as well. The diffracted radiation 397 follows another path at well-defined angles with respect to the angle of incidence then the reflected radiation 360. In FIG. 4, the drawn diffracted radiation 397 is drawn in a schematic manner and diffracted radiation 397 may follow many other paths than the drawn paths. The inspection apparatus 302 may also comprise further detection systems 398 that detect and/or image at least a portion of the diffracted radiation 397. In FIG. 4 a single further detection system 398 is drawn, but embodiments of the inspection apparatus 302 may also comprise more than one further detection system 398 that are arranged at different position to detect and/or image diffracted radiation 397 at a plurality of diffraction directions. In other words, the (higher) diffraction orders of the focused radiation beam that impinges on the target T are detected and/or imaged by one or more further detection systems 398. The one or more detection systems 398 generates a signal 399 that is provided to the metrology processor 320. The signal 399 may include information of the diffracted light 397 and/or may include images obtained from the diffracted light 397.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage and rotation stages. Processor 320 receives highly accurate feedback on the position and orientation of the substrate, via sensors. Sensors 374 may include interferometers, for example, which can give accuracy in the region of picometers. In the operation of the inspection apparatus 302, spectrum data 382 captured by detection system 318 is delivered to metrology processing unit 320.

As mentioned an alternative form of inspection apparatus uses SXR radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), coherent diffraction imaging (CDI) and at-resolution overlay (ARO) metrology. The SXR radiation may for example have wavelengths less than 100 nm, for example using radiation in the range 5-30 nm, of optionally in the range from 10 nm to 20 nm. The radiation may be narrowband or broadband in character.

Like the optical scatterometer used in today's production facilities, the inspection apparatus 302 can be used to measure structures within the resist material treated within the litho cell (After Develop Inspection or ADI), and/or to measure structures after they have been formed in harder material (After Etch Inspection or AEI). For example, substrates may be inspected using the inspection apparatus 302 after they have been processed by a developing apparatus, etching apparatus, annealing apparatus and/or other apparatus.

In this disclosure it is proposed to use the intensity of a so-called 'forbidden' diffraction order of a line grating to monitor line width variation (LCDU). For example, the even diffraction orders of a regular line grating with 50:50 duty cycle (i.e. lines and spaces have equal width and there is thus a line width/pitch ratio of 0.5) are typically absent, or very weak, from the diffraction pattern because of a large amount of destructive interference that leads to forbidding of the even orders. Deviations in line width from the 'ideal' value will result in the diffraction no longer being "forbidden", because there is less destructive interference. Thus these deviations can be easily detected without suffering from large background signals.

Figure 5:
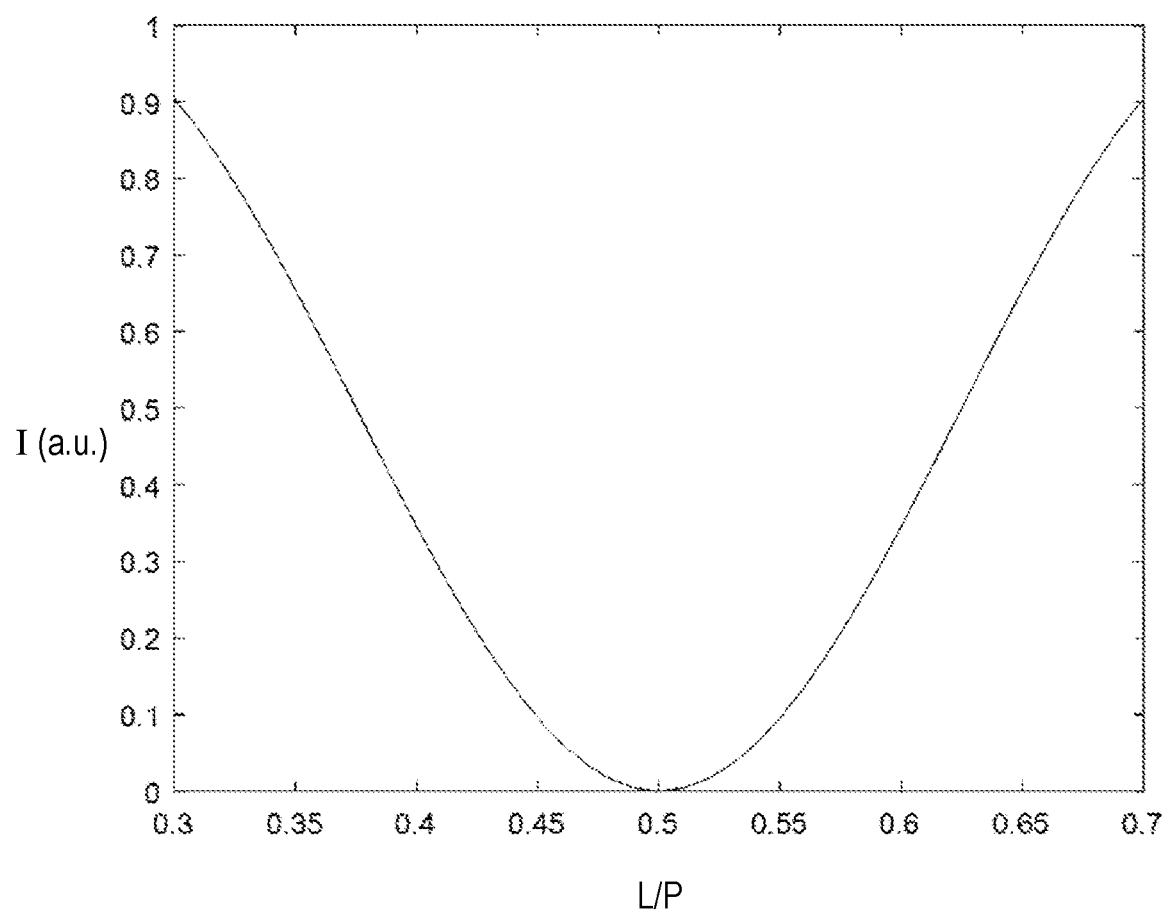
FIG. 5 depicts a chart in which a relation between a line width/line pitch ratio and the second order intensity under ideal conditions.

FIG. 5 is a schematic illustration of the second order diffracted intensity, I, in arbitrary units (y-axis) as a function of the line width over pitch ratio, L/P, of a grating (x-axis) is presented. The second order is a forbidden order. The intensity of the second order is minimal for a line width of half the pitch. The configuration of the line width over pitch ratio controls the amount of destructive interference that leads to forbidding of the second order.

Figure 6:
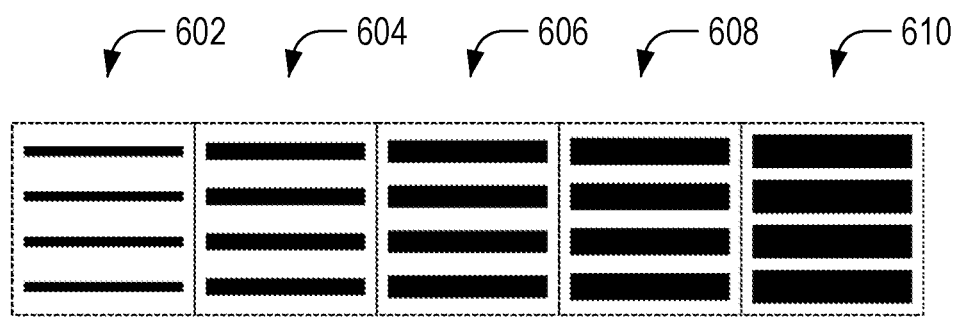
FIG. 6 depicts an embodiment of a metrology target having varying line width/line pitch ratios.

In practice the pitch of structures on the wafer is accurately controlled, but the line width can deviate from the line width on the reticle due to deviations in focus, dose, or processing effects. In an embodiment, a metrology target is put on the reticle composed of pads with a varying line/pitch ratio (e.g. by varying the line width), and the second order intensity of diffraction from these pads is measured. An example of such a metrology target is presented in FIG. 6. The metrology target of FIG. 6 is composed of five pads 602 to 610 with line gratings and each pad has a different line width/pitch ratio. The pad with the lowest second order intensity is closest to the line/pitch ratio=0.5 on the wafer. In this way the delta between line width as defined on the reticle and line width on the wafer can be measured.

A metrology target may be an ensemble of composite gratings, formed by a lithographic process, mostly in resist, but also after etch process for example.

Using these measurements, the exposure and processing conditions can be optimized and controlled to achieve the desired values on the wafer.

As an alternative to the variation in line width with constant pitch as shown in FIG. 6, the pitch may be varied with constant linewidth, or width and pitch may be varied simultaneously. In each case, the variation controls the amount of destructive interference that leads to forbidding of the diffraction order. Additionally, in FIG. 6 the width/pitch ratio increases from left (602) to right (610). This ordering is not necessary. The different width/pitch ratios may for example be distributed randomly over the different portions of the metrology target.

The method outlined above would require a lot of different pads to achieve a good measurement granularity. Therefore in an embodiment a limited number of pads are used and the measured second order intensity are fitted with an appropriate function (e.g. a parabola) to get an accurate estimate of the position of the minimum of the curve. In order to fit a parabola a minimum of at least three pads would be required. The gratings may be oriented in X or Y direction, or both directions can be measured.

The range of line widths in the grating pads may be chosen large enough, such that the optimum is captured (i.e.

there should be at least one width on either side of the optimum), but at the same time should be small enough such that steps in width are sufficiently small to determine the exact position of the minimum with sufficient accuracy.

Figure 7:
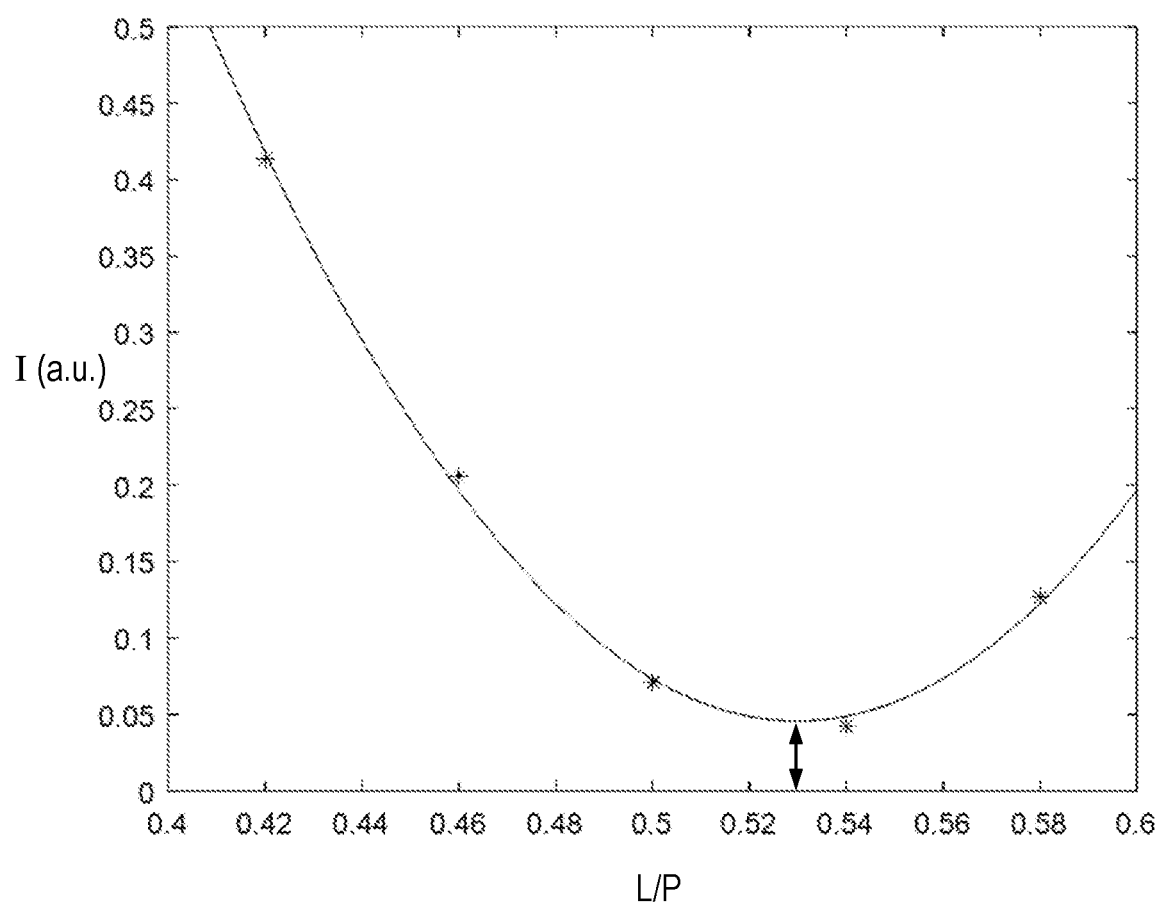
FIG. 7 depicts a chart in which measurements of, for example, a printed metrology target of FIG. 6 are plotted and a parabola is fitted to the measurements.

FIG. 7 presents a chart in which different intensity measurements of the second diffraction order (y-axis) are plotted against the different line width/pitch ratios. The stars represent the measurements of the different portions of the metrology target (for example, the different pads of the metrology target of FIG. 6). The line is a fitted parabola through the measured points.

In the context of FIG. 7, the second order diffraction efficiency is measured on 5 pads with varying line width/pitch ratio's. A parabola is fitted through the data points to determine the position of the minimum. In this case that is found at a line/pitch ratio (on the reticle) of 0.53, indicating that the lines on the wafer are slightly thinner than nominal (the minimum corresponds to a ratio of 0.5 on the wafer). The minimum does not reach zero, which is a measure of the amount of Local Critical Dimension Uniformity (LCDU) present.

Under ideal LCDU conditions it is expected to have the minimum of the fitted parabola of FIG. 7 at zero intensity. As indicated in the figure with the double headed arrow, there is a distance between zero intensity and the minimum point of the fitted parabola. This distance between zero intensity and the minimum point of the fitted parabola is the result of Line Edge Roughness and is a measure for the amount of LCDU.

In practice the printed line pattern is not perfectly regular. The line width fluctuates along the lines. In the method outlined above this implies that many line widths are observed simultaneously and the observed intensity is an average over all these different line widths. As a consequence the observed curve will be 'blurred', and the minimum will become less sharp and less deep. While this is not favourable for detecting the position of the minimum, it creates a new opportunity: by not only detecting the lateral position of the minimum, but also the depth of the minimum we can obtain a measure of the line width variation (LCDU).

By measuring the depth of the minimum, the process conditions can be optimized to minimize LCDU and thus improve EPE.

Since the most interesting line widths in current and future nodes are well below 100 nm, preferably small pitches (<200 nm) are used. If the pitch and line widths in the targets are similar to the pitches and line widths of the structures in the integrated circuit, the detected amount of LCDU or Line-Edge-Roughness parameters will represent the LCDU or Line-Edge-Roughness parameters of the structures in the integrated circuit. Therefore this method is preferably combined with short wavelengths, such as wavelengths in the range from 1 nm to 100 nm, or optionally 5 nm to 50 nm, or optionally 10 nm to 20 nm, such that second order diffraction peaks exist.

Alternatively the targets can use larger line widths and pitches than the normal product features. This may result in offsets between what is measured on the target and on the device, but it would be possible to use conventional optical scatterometry.

Figure 8:
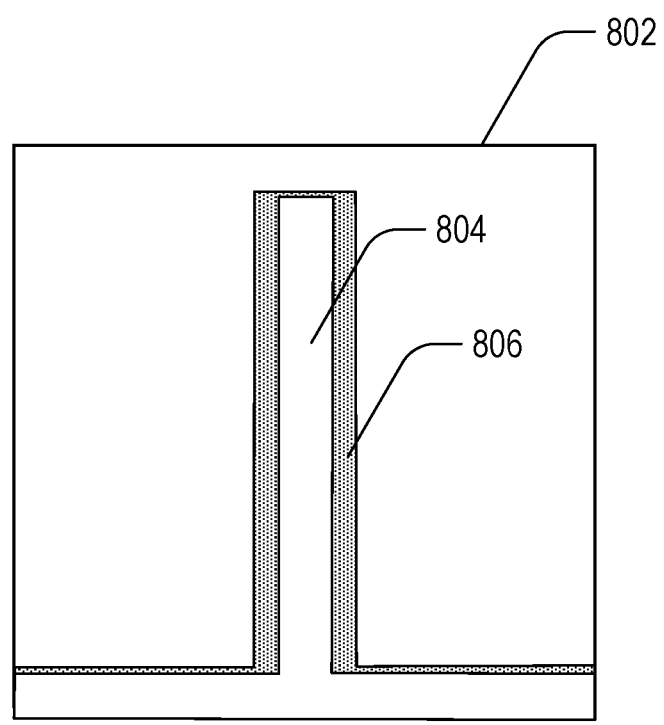
FIG. 8 depicts a cross-sectional view of a structure for which simulations have been performed.

In order to verify that this method can produce meaningful results on real stacks some simulations were performed. The simulated geometry 802, resembling a "fin" structure, is shown in FIG. 8. Here the silicon 'line' 804 has a real non-zero height, and is coated with $SiO_2$ 806.

Figure 9:
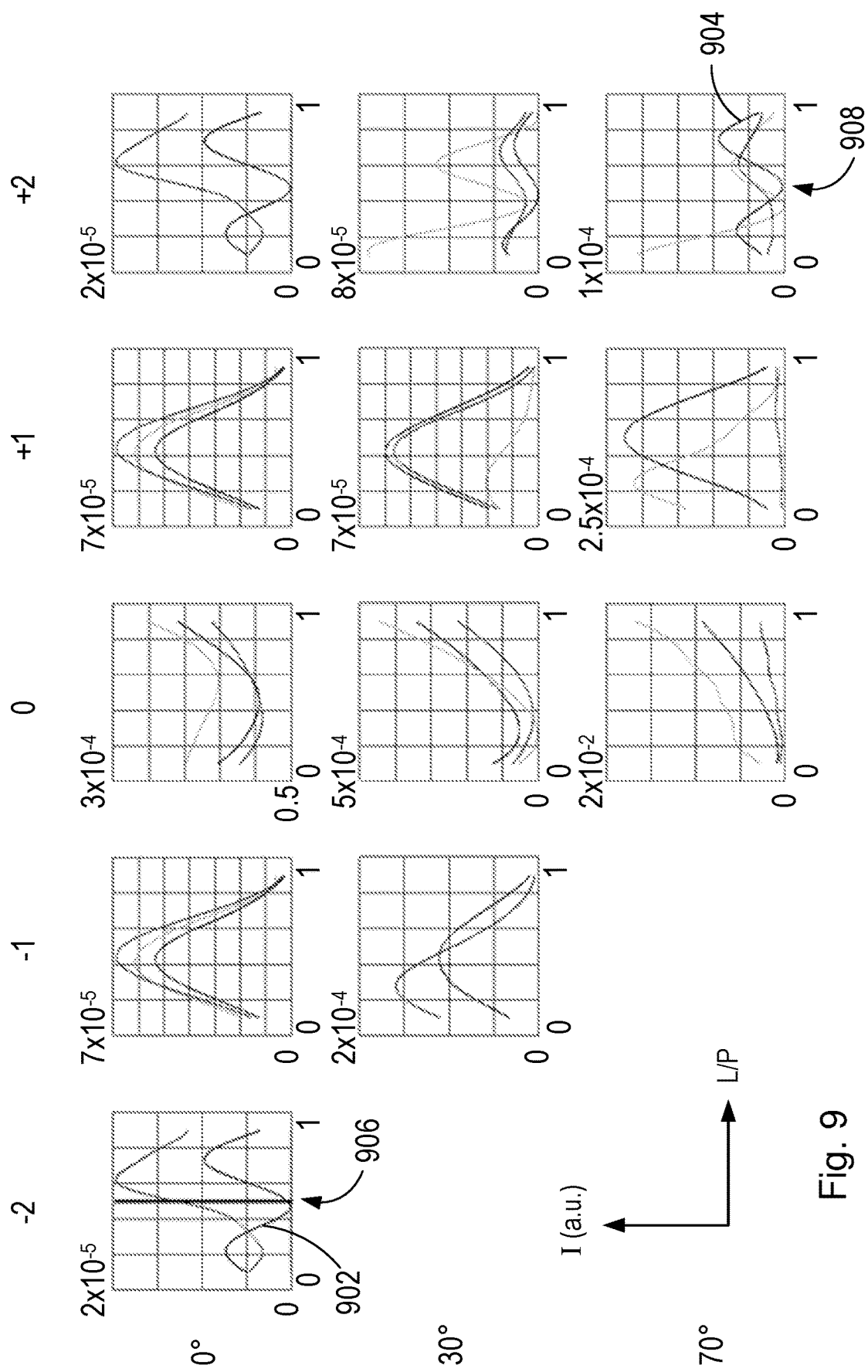
FIG. 9 depicts a number of charts with simulation results of the structure of FIG. 8.

FIG. 9 presents simulated diffraction efficiencies as a function of duty cycle. This is done for three angles of incidence (0, 30 and 70 degrees in the top, middle and bottom rows respectively), five diffraction orders (−2 to +2, left to right), and three different wavelengths (10, 15 and 20 nm). The grating pitch was 32 nm. As for FIG. 5, the second order diffracted intensity, I, in arbitrary units (y-axis) is plotted as a function of the line width over pitch ratio, L/P (x-axis).

As can be seen in the simulation results shown in FIG. 9, the general principle works for the second order diffractions at a particular wavelength. For example, the curves 902 at top left and 904 bottom right have minima close to the 0.5 duty cycle, 906 and 908 respectively. But at the same time the result is wavelength dependent (see all other curves), and the exact position of the minima can be somewhat shifted with respect to a duty cycle of 0.5. Most likely this is caused by the $SiO_2$ coating that is included in the simulation, that makes the exact definition of the duty cycle somewhat ambiguous, and due to the material properties also wavelength dependent.

This method may be combined with scatterometer recipe optimization to find the best measurement settings, such as the optimum wavelength.

With reference to FIG. 4, the metrology apparatus 302 may be used to implement embodiments of the present invention. It has a measurement position for receiving a substrate W, where the structure of interest is held for inspection. The radiation system 310 provides a spot S of radiation at the measurement position. The detection system 398 is a sensor for measuring intensity of a forbidden diffraction order 397 being diffracted by the metrology target T at the measurement position when the metrology target is illuminated by the spot S of radiation. The sensor 398 is configured to provide a measurement signal 399 based on the measured intensity.

The metrology processor 320 is a controller operable to receive the measurement signal 399 and determine an edge roughness parameter based on the measured intensity of the forbidden diffraction order. The edge roughness parameter may comprise local critical dimension uniformity (LCDU) or a line edge roughness parameter (LER).

The metrology target T comprises a repetitive pattern (such as those illustrated in FIG. 6) being configured to control an amount of destructive interference that leads to forbidding of the diffraction order. The repetitive pattern is configured to control the amount of destructive interference by configuration of a linewidth/pitch ratio.

The metrology target may be provided on a patterning device, such as for example a reticle, or may be patterned on a substrate, such as for example a wafer. The metrology target comprises a plurality of regions, wherein, in the different regions, different repetitive patterns are provided having different configurations to differently control an amount of destructive interference that leads to forbidding of a diffraction order. In the different regions, different repetitive patterns may be provided having different line width/pitch ratios.

A method of determining an edge roughness parameter is performed. The method comprises:

providing a spot S of radiation at the measurement position;

measuring intensity of a forbidden diffraction order being diffracted by metrology target T at the measurement position, the metrology target comprising a repetitive pattern configured to control an amount of destructive interference that leads to forbidding of the diffraction order; and determining an edge roughness parameter based on the measured intensity of the forbidden diffraction order.

In an embodiment, corresponding to FIG. 10, the metrology apparatus may measure one grating with a nominal on-wafer 0.5 linewidth/pitch ratio. In this example, process control is relied on to set the on-wafer ratio to exactly or as close as possible to 0.5. There is no compensation for unknown CD shifts in the metrology and it is assumed that the curve (of the type shown in FIG. 7) is centred on the 0.5 line/pitch ratio. The forbidden diffraction order is a second order and the repetitive pattern is thus configured with a line width/pitch ratio of about 0.5.

In some embodiments, corresponding to FIGS. 11 and 12, an independent CD measurement/prediction is used to compensate for unknown CD shift, with measurement of one or more repetitive pattern. The controller 320 is operable to receive or determine a critical dimension value of the repetitive pattern. The CD value may be obtained by conventional CD measurements using the scatterometer, for example using reconstruction of the repetitive pattern, based on measured diffraction patterns. The controller 320 is then operable to determine a minimum intensity value of the forbidden diffraction order using the critical dimension value. It then determines the edge roughness parameter based on the determined minimum intensity value. In the case of grating with a simple square wave profile, the repetitive pattern has a line width/pitch ratio around 0.5. The forbidden diffraction in that case is an even order, and is the second order in particular. In general, the index of the diffraction order that is forbidden depends on the shape and materials of the repetitive pattern, and wavelength dependence.

Based on the CD, the controller can determine which repetitive pattern is most likely to have minimum forbidden order intensity, and measure it (see FIG. 11). In this case, the CD is known along with some estimate of the response curve, and the measured repetitive pattern's on-wafer ratio is close enough to the minimum of the curve so that LCDU variation creates a sufficient intensity change. Alternatively, the controller can determine which two or more gratings have minimum intensity, and measure them. If more than one measurement is made, then the lowest intensity may be selected from the multiple measurements, or curve fitting may be used to calculate the minimum intensity. In all those examples, the controller 320 is operable to determine the minimum intensity value of the forbidden diffraction order by selecting a repetitive pattern for the intensity measurement, the selection being based on the critical dimension value.

Alternatively see (FIG. 12), the controller 320 can correct the intensity measurement using the CD and a model (measured/predicted knowledge) of the shape of the intensity/ratio curve (see FIG. 7). This may be done with one, two, or more repetitive patterns. Based on the CD value and a model the intensity can be predicted on a given repetitive pattern for the ideal case with 'no' LCDU, and the measured intensity can be compared with that predicted value. It is again preferable for the measured repetitive pattern's on-wafer ratio to be close to the minimum of the curve. Otherwise the intensity change due local variations will be negligible. This is because at the minimum excursions will always create an upward change in intensity, whereas away from the minimum it can go up and down, so the fluctuations average out. In the example with reference to FIG. 4, the controller 320 determines the minimum intensity value of the forbidden diffraction order using a model of the intensity of the forbidden diffraction order as a function of the critical dimension value.

Other embodiments, corresponding to FIG. 13, use measurements of more than one repetitive structure to compensate for unknown CD shift and determine the minimum intensity.

In the example with reference to FIG. 4, the controller 320 receives one or more measurement signals based on measured intensity from a plurality of repetitive patterns respectively configured to control an amount of destructive interference that leads to forbidding of the diffraction order. The controller 320 then determines a minimum intensity value of the forbidden diffraction order based on the measured intensity of the forbidden diffraction order from the plurality of repetitive patterns. The controller 320 determines the edge roughness parameter based on the determined minimum intensity value.

The controller may determine the minimum intensity value of the forbidden diffraction order by selecting a minimum intensity of intensities measured for a plurality of repetitive patterns. Alternatively, it may determine the minimum intensity value of the forbidden diffraction order by fitting measured intensity for a plurality of repetitive patterns to a function having an extremum. The function may comprises parabolic function as shown in FIG. 7.

In the embodiments discussed above where a minimum intensity value is determined, the controller is operable to determine the edge roughness parameter based on a deviation between the determined minimum intensity value and zero.

Thus in an example, one of the plurality of repetitive patterns is illuminated by the spot of radiation, the intensity of the second diffracted order is smaller than the intensity of the second diffracted order of another one of the plurality of repetitive patterns when the other one is illuminated by the spot of radiation, the one of the plurality of repetitive patterns having a first line width/pitch ratio, another one of the plurality of repetitive patterns having at least a second line width/pitch ratio being smaller than the first line width/pitch ratio and a further another one of the plurality of repetitive patterns having at least a third line width/pitch ratio being larger than the first line width/pitch ratio, optionally the first line width/pitch ratio being about 0.5.

In the embodiments described herein, the radiation may comprise a wavelength or a plurality of wavelengths in a wavelength range from 1 nm to 100 nm, or optionally in a wavelength range from 5 nm to 50 nm, or optionally in a wavelength range from 10 nm to 20 nm. The radiation may comprises wavelength or a plurality of wavelengths selected to optimise an amount of destructive interference that leads to forbidding of the diffraction order by the plurality of the repetitive patterns.

The lithographic cell LC of FIG. 2 may be used to implement embodiments of the present invention, when the lithographic cell comprises a metrology apparatus MET described herein.

FIG. 10 is a flowchart of a method of determining an edge roughness parameter according to an embodiment of the present invention. The method has the following steps:

Illumination step 1010, ILL: Controlling a radiation system to provide a spot of radiation at a measurement position for receiving a substrate.

Step 1020, MEA: Receiving a measurement signal from a sensor for measuring intensity of a forbidden diffraction order being diffracted by a metrology target at the measurement position when the metrology target is illuminated by the spot of radiation, the metrology target comprising a repetitive pattern being configured to control an amount of destructive interference that leads to forbidding of the diffraction order, the sensor being configured to provide the measurement signal based on the measured intensity. The repetitive pattern is configured to control the amount of destructive interference by configuration of a linewidth/pitch ratio. The forbidden diffraction order is the second order with the repetitive pattern being configured with a line width/pitch ratio of about 0.5.

Step 1040: Determining an edge roughness parameter based on the measured intensity of the forbidden diffraction order. The edge roughness parameter may comprise local critical dimension uniformity (LCDU).

FIG. 11 is a flowchart of a method of determining an edge roughness parameter according to another embodiment of the present invention. The method has the following steps:

Step 1110, ILL: Controlling a radiation system to provide a spot of radiation at a measurement position for receiving a substrate.

Step 1120, MIN: Receiving or determining a critical dimension (CD) value 1112 of the repetitive pattern. Determining a minimum intensity value of the forbidden diffraction order using the critical dimension value by selecting a repetitive pattern for the intensity measurement. The selection is based on the critical dimension value.

Step 1130, MEA: Receiving a measurement signal from a sensor for measuring intensity of a forbidden diffraction order being diffracted by a selected metrology target at the measurement position when the metrology target is illuminated by the spot of radiation, the metrology target comprising a repetitive pattern being configured to control an amount of destructive interference that leads to forbidding of the diffraction order, the sensor being configured to provide the measurement signal based on the measured intensity.

Step 1140, LCDU: Determining an edge roughness parameter based on the determined minimum intensity value based on the measured intensity of the forbidden diffraction order. The edge roughness parameter may comprise local critical dimension uniformity (LCDU).

FIG. 12 is a flowchart of a method of determining an edge roughness parameter according to another embodiment of the present invention. The method has the following steps:

Step 1210, ILL: Controlling a radiation system to provide a spot of radiation at a measurement position for receiving a substrate.

Step 1220, MEA: Receiving a measurement signal from a sensor for measuring intensity of a forbidden diffraction order being diffracted by a metrology target at the measurement position when the metrology target is illuminated by the spot of radiation, the metrology target comprising a repetitive pattern being configured to control an amount of destructive interference that leads to forbidding of the diffraction order, the sensor being configured to provide the measurement signal based on the measured intensity.

Step 1230, MIN: Receiving or determining a critical dimension (CD) value 1222 of the repetitive pattern. Determining a minimum intensity value of the forbidden diffraction order using the critical dimension value and using a model (MOD) 1224 of the intensity of the forbidden diffraction order as a function of the critical dimension value.

Step 1240, LCDU: Determining an edge roughness parameter based on the determined minimum intensity value based on the measured intensity of the forbidden diffraction order. The edge roughness parameter may comprise local critical dimension uniformity (LCDU).

FIG. 13 is a flowchart of a method of determining an edge roughness parameter according to another embodiment of the present invention. The method has the following steps:

Step 1310, ILL: Controlling a radiation system to provide a spot of radiation at a measurement position for receiving a substrate.

Step 1320, MEA: Receiving a measurement signal from a sensor for measuring intensity of a forbidden diffraction order being diffracted by a metrology target at the measurement position when the metrology target is illuminated by the spot of radiation, the metrology target comprising a repetitive pattern being configured to control an amount of destructive interference that leads to forbidding of the diffraction order, the sensor being configured to provide the measurement signal based on the measured intensity. One or more measurement signals are received. These are based on measured intensity from a plurality of repetitive patterns respectively configured to control an amount of destructive interference that leads to forbidding of the diffraction order. The forbidden diffraction order may be a second diffraction order and the plurality of repetitive patterns comprise line width/pitch ratios around 0.5.

Step 1330, MIN: Determining a minimum intensity value of the forbidden diffraction order based on the measured intensity of the forbidden diffraction order from the plurality of repetitive patterns. This may be done by selecting a minimum intensity of intensities measured for a plurality of repetitive patterns. Alternatively, it may be done by fitting measured intensity for a plurality of repetitive patterns to a function having an extremum, such as a parabolic function.

Step 1340, LCDU: Determining an edge roughness parameter based on the determined minimum intensity value and thus also based on the measured intensity of the forbidden diffraction order. The edge roughness parameter may comprise local critical dimension uniformity (LCDU).

The methods described with reference to FIGS. 10 to 13 may be implemented by one or more processor, such as a controller of a metrology apparatus. A computer program product comprising a non-transitory computer readable medium having instructions recorded thereon, may implement the methods when executed by one or more processor.

In the methods described with reference to FIGS. 11 to 13, the repetitive pattern may be configured to control the amount of destructive interference by configuration of a linewidth/pitch ratio. The forbidden diffraction order may be an even diffraction order. For example, the forbidden diffraction order may be a second order with the repetitive pattern being configured with a line width/pitch ratio of about 0.5. The edge roughness parameter may be determined based on a deviation between the determined minimum intensity value and zero.

Embodiments may provide: i) A metrology target with pads with different line widths (around line/pitch=0.5); ii) A method to analyze the measured second order intensity to derive LCDU; iii) An optical method to measure LCDU.

This results in the following advantages. The main benefits of the embodiments described herein are that they are simple, fast, do not need accurate stack (of lithographic layers) information, and can provides both CD and LCDU information. Compared to existing metrology: a) Extracting LCDU information from reconstructions is extremely challenging, while embodiments provide a very simple, easily interpretable metric. b) CD-SEM can extract CD and LCDU information but is very slow and thus cannot achieve the sampling and averaging that an optical method can achieve.

Although specific reference may be made in this text to embodiments of the invention in the context of a metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

In the context of the above document the term HHG or HHG source is introduced. HHG refers to High Harmonic Generation or sometimes referred to as high order harmonic generation. HHG is a non-linear process in which a target, for example a gas, a plasma or a solid sample, is illuminated by an intensive laser pulse. Subsequently, the target may emit radiation with a frequency that is a multiple of the frequency of the radiation of the laser pulse. Such frequency, that is a multiple, is called a harmonic of the radiation of the laser pulse. One may define that the generated HHG radiation is a harmonic above the fifth harmonic and these harmonics are termed high harmonics. The physical process that forms a basis of the HHG process is different from the physical process that relates to generating radiation of the lower harmonics, typically the $2^{nd}$ to $5^{th}$ harmonic. The generation of radiation of the lower harmonic relates to perturbation theory. The trajectory of the (bound) electron of an atom in the target is substantially determined by the Coulomb potential of the host ion. In HHG, the trajectory of the electron that contributes to the HHG process is substantially determined by the electric field of the incoming laser light. In the so-called "three step model" describing HHG, electrons tunnel through the Coulomb barrier which is at that moment substantially suppressed by the laser field (step 1), follow a trajectory determined by the laser field (step 2) and recombine with a certain probability while releasing their kinetic energy plus the ionization energy in the form of radiation (step 3). Another way of phrasing a difference between HHG and the generation of radiation of the lower harmonic is to define that all radiation with photon energy above the ionization energy of the target atoms as "High Harmonic" radiation, e.g. HHG generated radiation, and all radiation with photon energy below the ionization energy as non-HHG generated radiation. If Neon is used as a gas target, all radiation with a wavelength shorter than 62 nm (having a photon energy higher than 20.18 eV) is generated by means of the HHG process. For Argon as a gas target, all radiation having a photon energy higher than about 15.8 eV is generated by means of the HHG process.

According to the aspects of the present invention, there is provided:

A. A metrology apparatus comprising
a measurement position for receiving a substrate,
a radiation system for providing a spot of radiation at the measurement position,
a sensor for measuring the a second diffraction order being diffracted by a metrology target at the measurement position when the metrology target is illuminated by the spot of radiation, the metrology target comprising a repetitive pattern, the sensor being configured to provide a measurement signal,
a controller for receiving the measurement signal and for determining an amount of local critical dimension uniformity or line edge roughness parameters based on the measured second diffraction order.

B. A metrology apparatus according to clause A, wherein the repetitive pattern comprises a line width/pitch ratio of about 0.5 and wherein the controller is configured to determine the amount of local critical dimension uniformity or line edge roughness parameters based on a deviation between the intensity of the measured second diffraction order and zero.

C. A metrology apparatus according to any one of the previous clauses, wherein the metrology target comprises a plurality of repetitive patterns comprising line width/pitch ratios, the metrology apparatus being configured to measure the second diffraction order for the plurality of repetitive patterns, and the controller being configured to determine a curve through the measurement points of the repetitive patterns and use a minimum intensity of the curve as a value for determining an amount of local critical dimension uniformity or line edge roughness parameters.

D. A metrology apparatus according to clause C, wherein, when irradiation is illuminated on one of the plurality of repetitive patterns, the intensity of second diffracted order is smaller than the intensity of the second diffracted order of the other one of the plurality of repetitive patterns when the other one of the plurality of repetitive patterns are illuminated by radiation, the one of the plurality of repetitive patterns having a first line width/pitch ratio, another one of the plurality of repetitive patterns having at least a second line width/pitch ratio being smaller than the first line width/pitch ratio and a further another one of the plurality of repetitive patterns having at least a third line width/pitch ratio being larger than the first line width/pitch ratio, optionally the first line width/pitch ratio being about 0.5.

E. A metrology apparatus according to any one of the previous clauses, wherein the radiation comprises a wavelength or a plurality of wavelengths in a wavelength range from 1 nm to 100 nm, or optionally in a wavelength range from 5 nm to 50 nm, or optionally in a wavelength range from 10 nm to 20 nm.

F. A lithographic cell comprising the metrology apparatus according to any one of the previous clauses.

G. A metrology target being provided on a patterning device, such as for example a reticle, or being patterned on a substrate, such as for example a wafer, the metrology target comprises a plurality of regions, wherein in the different regions different repetitive patterns are provided having different line width/pitch ratios.

H. A method of determining an amount of local critical dimension uniformity or line edge roughness parameters, the method comprises
providing a spot of radiation at the measurement position,
measuring the a second diffraction order being diffracted by a metrology target at the measurement position, the metrology target comprising a repetitive pattern
determining an amount of local critical dimension uniformity or line edge roughness parameters based on the measured second diffraction order.

I. A method according to clause H, wherein
the repetitive pattern comprises a line width/pitch ratio of about 0.5, the determining of the amount of local critical dimension uniformity or line edge roughness parameters is based on a deviation of the intensity of the measured second diffraction order and zero.

J. A method according to clauses H or J, wherein the metrology target comprises a plurality of repetitive patterns comprising line width/pitch ratios, the measuring comprising measuring the second diffraction order for the plurality of repetitive patterns, and the method comprises determining a curve through the measurement points of the repetitive patterns and using a minimum intensity of the curve as a value for determining an amount of local critical dimension uniformity or line edge roughness parameters.

K. A computer program product comprising a non-transitory computer readable medium having instructions recorded thereon, the instructions, when executed by a controller of a metrology apparatus, implementing the method of any one of the clauses H to J.

Further embodiments are provided in the subsequent numbered clauses:

1. A metrology apparatus comprising:
a measurement position for receiving a substrate;
a radiation system for providing a spot of radiation at the measurement position; and
a sensor for measuring intensity of a forbidden diffraction order being diffracted by a metrology target at the measurement position when the metrology target is illuminated by the spot of radiation, the metrology target comprising a repetitive pattern being configured to control an amount of destructive interference that leads to forbidding of the diffraction order, the sensor being configured to provide a measurement signal based on the measured intensity,
a controller operable to:
receive the measurement signal; and
determine an edge roughness parameter based on the measured intensity of the forbidden diffraction order.

2. A metrology apparatus according to clause 1, wherein the repetitive pattern is configured to control the amount of destructive interference by configuration of a linewidth/pitch ratio.

3. A metrology apparatus according to clause 1 or clause 2, wherein the edge roughness parameter comprises local critical dimension uniformity.

4. A metrology apparatus according to any preceding clause, wherein the forbidden diffraction order is a second order and the repetitive pattern is configured with a line width/pitch ratio of about 0.5.

5. A metrology apparatus according to any of clauses 1 to 3, wherein the controller is operable to:
receive or determine a critical dimension value of the repetitive pattern;
determine a minimum intensity value of the forbidden diffraction order using the critical dimension value; and
determine the edge roughness parameter based on the determined minimum intensity value.

6. A metrology apparatus according to clause 5, wherein the controller is operable to:
determine the minimum intensity value of the forbidden diffraction order by selecting a repetitive pattern for the intensity measurement, the selection being based on the critical dimension value.

7. A metrology apparatus according to clause 5, wherein the controller is operable to:
determine the minimum intensity value of the forbidden diffraction order using a model of the intensity of the forbidden diffraction order as a function of the critical dimension value.

8. A metrology apparatus according to any of clauses 1 to 3, wherein the controller is operable to:
receive one or more measurement signals based on measured intensity from a plurality of repetitive patterns respectively configured to control an amount of destructive interference that leads to forbidding of the diffraction order;
determine a minimum intensity value of the forbidden diffraction order based on the measured intensity of the forbidden diffraction order from the plurality of repetitive patterns; and
determine the edge roughness parameter based on the determined minimum intensity value.

9. A metrology apparatus according to clause 8, wherein the controller is operable to:
determine the minimum intensity value of the forbidden diffraction order by selecting a minimum intensity of intensities measured for a plurality of repetitive patterns.

10. A metrology apparatus according to clause 8, wherein the controller is operable to:
determine the minimum intensity value of the forbidden diffraction order by fitting measured intensity for a plurality of repetitive patterns to a function having an extremum.

11. A metrology apparatus according to clause 10, wherein the function comprises a parabolic function.

12. A metrology apparatus according to any of clauses 5 to 11, wherein the controller is operable to determine the edge roughness parameter based on a deviation between the determined minimum intensity value and zero.

13. A metrology apparatus according to any of clauses 5 to 12, wherein the forbidden diffraction order is an even diffraction order.

14. A metrology apparatus according to clause 13, wherein the even diffraction order is a second order.

15. A metrology apparatus according to any of clauses 8 to 11 and clause 12 when dependent on any of clauses 8 to 11, wherein the forbidden diffraction order is a second diffraction order and the plurality of repetitive patterns comprise line width/pitch ratios around 0.5.

16. A metrology apparatus according to any of clauses 8 to 12, wherein, when one of the plurality of repetitive patterns is illuminated by the spot of radiation, the intensity of the second diffracted order is smaller than the intensity of the second diffracted order of another one of the plurality of repetitive patterns when the other one is illuminated by the spot of radiation, the one of the plurality of repetitive patterns having a first line width/pitch ratio, another one of the plurality of repetitive patterns having at least a second line width/pitch ratio being smaller than the first line width/pitch ratio and a further another one of the plurality of repetitive patterns having at least a third line width/pitch ratio being larger than the first line width/pitch ratio, optionally the first line width/pitch ratio being about 0.5.

17. A metrology apparatus according to any preceding clause, wherein the radiation comprises a wavelength or a plurality of wavelengths in a wavelength range from 1 nm to 100 nm, or optionally in a wavelength range from 5 nm to 50 nm, or optionally in a wavelength range from 10 nm to 20 nm.

18. A metrology apparatus according to any preceding clause, wherein the radiation comprises a wavelength or a plurality of wavelengths selected to optimise an amount of destructive interference that leads to forbidding of the diffraction order by the plurality of the repetitive patterns.

19. A lithographic cell comprising the metrology apparatus according to any preceding clause.

20. A metrology target being provided on a patterning device, such as for example a reticle, or being patterned on a substrate, such as for example a wafer, the metrology target comprising a plurality of regions, wherein, in the different regions, different repetitive patterns are provided having different configurations to differently control an amount of destructive interference that leads to forbidding of a diffraction order.

21. The metrology target of clause 20, wherein, in the different regions, different repetitive patterns are provided having different line width/pitch ratios and, optionally, one repetitive pattern has a width/pitch ratio around 0.5.

22. A method of determining an edge roughness parameter, the method comprising:

providing a spot of radiation at a measurement position;

measuring intensity of a forbidden diffraction order being diffracted by a metrology target at the measurement position, the metrology target comprising a repetitive pattern configured to control an amount of destructive interference that leads to forbidding of the diffraction order; and determining an edge roughness parameter based on the measured intensity of the forbidden diffraction order.

23. A method according to clause 22, wherein the repetitive pattern is configured to control the amount of destructive interference by configuration of a linewidth/pitch ratio.

24. A method according to clause 22 or clause 23, wherein the edge roughness parameter comprises local critical dimension uniformity.

25. A method of determining an edge roughness parameter, the method comprising:

controlling a radiation system to provide a spot of radiation at a measurement position for receiving a substrate;

receiving a measurement signal from a sensor for measuring intensity of a forbidden diffraction order being diffracted by a metrology target at the measurement position when the metrology target is illuminated by the spot of radiation, the metrology target comprising a repetitive pattern being configured to control an amount of destructive interference that leads to forbidding of the diffraction order, the sensor being configured to provide the measurement signal based on the measured intensity; and determining an edge roughness parameter based on the measured intensity of the forbidden diffraction order.

26. A method according to clause 25, wherein the repetitive pattern is configured to control the amount of destructive interference by configuration of a linewidth/pitch ratio.

27. A metrology apparatus according to clause 25 or clause 26, wherein the edge roughness parameter comprises local critical dimension uniformity.

28. A method according to any preceding clause, wherein the forbidden diffraction order is a second order and the repetitive pattern is configured with a line width/pitch ratio of about 0.5.

29. A method according to any of clauses 25 to 27, comprising:

receiving or determining a critical dimension value of the repetitive pattern;

determining a minimum intensity value of the forbidden diffraction order using the critical dimension value; and determining the edge roughness parameter based on the determined minimum intensity value.

30. A method according to clause 29, comprising:

determining the minimum intensity value of the forbidden diffraction order by selecting a repetitive pattern for the intensity measurement, the selection being based on the critical dimension value.

31. A method according to clause 29, comprising:

determining the minimum intensity value of the forbidden diffraction order using a model of the intensity of the forbidden diffraction order as a function of the critical dimension value.

32. A method according to any of clauses 25 to 27, comprising:

receiving one or more measurement signals based on measured intensity from a plurality of repetitive patterns respectively configured to control an amount of destructive interference that leads to forbidding of the diffraction order;

determining a minimum intensity value of the forbidden diffraction order based on the measured intensity of the forbidden diffraction order from the plurality of repetitive patterns; and determining the edge roughness parameter based on the determined minimum intensity value.

33. A method according to clause 32, comprising:

determining the minimum intensity value of the forbidden diffraction order by selecting a minimum intensity of intensities measured for a plurality of repetitive patterns.

34. A method according to clause 32, comprising to:

determining the minimum intensity value of the forbidden diffraction order by fitting measured intensity for a plurality of repetitive patterns to a function having an extremum.

35. A method according to clause 34, wherein the function comprises a parabolic function.

36. A method according to any of clauses 29 to 35, comprising determining the edge roughness parameter based on a deviation between the determined minimum intensity value and zero.

37. A method according to any of clauses 29 to 36, wherein the forbidden diffraction order is an even diffraction order.

38. A method according to clause 13, wherein the even diffraction order is a second order.

39. A method according to any of clauses 32 to 35 and clause 36 when dependent on any of clauses 32 to 35, wherein the forbidden diffraction order is a second diffraction order and the plurality of repetitive patterns comprise line width/pitch ratios around 0.5.

40. A computer program product comprising a non-transitory computer readable medium having instructions recorded thereon, the instructions, when executed by a controller of a metrology apparatus, implementing the method of any one of the clause 25 to 39.

The invention claimed is:

1. A metrology apparatus comprising:

a radiation system configured to provide a spot of radiation at a measurement position of a substrate;

a sensor configured to measure intensity of a forbidden diffraction order being diffracted by a metrology target at the measurement position in response to illumination of the metrology target by the spot of radiation, the metrology target comprising a repetitive pattern being configured to control an amount of destructive interference that leads to forbidding of the diffraction order, the sensor being configured to provide a measurement signal based on the measured intensity; and a controller operable to:
  receive the measurement signal; and
  determine an edge roughness parameter based on the measured intensity of the forbidden diffraction order.

2. The metrology apparatus of claim 1, wherein the repetitive pattern is configured to control the amount of destructive interference by configuration of a linewidth/pitch ratio.

3. The metrology apparatus of claim 1, wherein the edge roughness parameter comprises local critical dimension uniformity.

4. The metrology apparatus of claim 1, wherein the forbidden diffraction order is a second order and the repetitive pattern is configured with a line width/pitch ratio of about 0.5.

5. The metrology apparatus of claim 1, wherein the controller is operable to:
  receive or determine a critical dimension value of the repetitive pattern;
  determine a minimum intensity value of the forbidden diffraction order using the critical dimension value; and
  determine the edge roughness parameter based on the determined minimum intensity value.

6. The metrology apparatus of claim 5, wherein the controller is operable to determine the minimum intensity value of the forbidden diffraction order:
  by selecting a repetitive pattern for the intensity measurement, the selection being based on the critical dimension value, or
  using a model of the intensity of the forbidden diffraction order as a function of the critical dimension value.

7. The metrology apparatus of claim 5, wherein the controller is operable to: determine the minimum intensity value of the forbidden diffraction order by fitting
  measured intensity for a plurality of repetitive patterns to a function having an extremum, wherein the function comprises a parabolic function.

8. The metrology apparatus of claim 5, wherein the controller is operable to determine the edge roughness parameter based on a deviation between the determined minimum intensity value and zero.

9. The metrology apparatus of claim 5, wherein the forbidden diffraction order is an even diffraction order and, optionally, the even diffraction order is a second order.

10. The metrology apparatus of claim 1, wherein the controller is operable to:
  receive one or more measurement signals based on measured intensity from a plurality of repetitive patterns respectively configured to control an amount of destructive interference that leads to forbidding of the diffraction order;
  determine a minimum intensity value of the forbidden diffraction order based on the measured intensity of the forbidden diffraction order from the plurality of repetitive patterns or by selecting a minimum intensity of intensities measured for a plurality of repetitive patterns; and
  determine the edge roughness parameter based on the determined minimum intensity value.

11. The metrology apparatus of claim 10, wherein the forbidden diffraction order is a second diffraction order and the plurality of repetitive patterns comprise line width/pitch ratios around 0.5.

12. The metrology apparatus of claim 10, wherein, when one of the plurality of repetitive patterns is illuminated by the spot of radiation, the intensity of the second diffracted order is smaller than the intensity of the second diffracted order of another one of the plurality of repetitive patterns when the other one is illuminated by the spot of radiation, the one of the plurality of repetitive patterns having a first line width/pitch ratio, another one of the plurality of repetitive patterns having at least a second line width/pitch ratio being smaller than the first line width/pitch ratio and a further another one of the plurality of repetitive patterns having at least a third line width/pitch ratio being larger than the first line width/pitch ratio, the first line width/pitch ratio being about 0.5.

13. The metrology apparatus of claim 1, wherein the radiation comprises a wavelength or a plurality of wavelengths in a wavelength range from 1 nm to 100 nm, or in a wavelength range from 5 nm to 50 nm, or in a wavelength range from 10 nm to 20 nm.

14. The metrology apparatus of claim 1, wherein the radiation comprises a wavelength or a plurality of wavelengths selected to optimise an amount of destructive interference that leads to forbidding of the diffraction order by the plurality of the repetitive patterns.

15. A lithographic cell comprising the metrology apparatus of claim 1.

16. A metrology target comprising:
  a plurality of regions, wherein, in the different regions, different repetitive patterns are provided having different configurations to differently control an amount of destructive interference that leads to forbidding of a diffraction order, and, in the different regions, different repetitive patterns are provided having different line width/pitch ratios and, one repetitive pattern has a width/pitch ratio around 0.5,
  wherein the metrology target is provided on a patterning device or a reticle or patterned on a substrate or a wafer.

17. A method of determining an edge roughness parameter, the method comprising:
  providing a spot of radiation at a measurement position;
  measuring intensity of a forbidden diffraction order being diffracted by a metrology target at the measurement position, the metrology target comprising a repetitive pattern configured to control an amount of destructive interference that leads to forbidding of the diffraction order; and
  determining the edge roughness parameter based on the measured intensity of the forbidden diffraction order.

18. A method of determining an edge roughness parameter, the method comprising:
  controlling a radiation system to provide a spot of radiation at a measurement position for receiving a substrate;
  receiving a measurement signal from a sensor for measuring intensity of a forbidden diffraction order being diffracted by a metrology target at the measurement position when the metrology target is illuminated by the spot of radiation, the metrology target comprising a repetitive pattern being configured to control an amount of destructive interference that leads to forbidding of the diffraction order, the sensor being configured to provide the measurement signal based on the measured intensity; and
  determining an edge roughness parameter based on the measured intensity of the forbidden diffraction order.

* * * * *